(12) United States Patent
Hsieh (10) Patent No.: US 6,592,323 B1
(45) Date of Patent: Jul. 15, 2003

(54) PLATE MEMBER CARRIER

(76) Inventor: Tsung-Chang Hsieh, No. 57, Yung An Street, Lung-Tan Hsiang (TW)

( * ) Notice: Subject to any disclaimer, the term of this patent is extended or adjusted under 35 U.S.C. 154(b) by 0 days.

(21) Appl. No.: 10/072,958

(22) Filed: Feb. 12, 2002

(51) Int. Cl.[7] ................................................. B66C 1/00
(52) U.S. Cl. ....................... 414/737; 414/729; 414/732; 414/733; 414/738; 414/917; 901/12; 901/40; 198/471.1; 198/750.12
(58) Field of Search ................................ 414/729, 732, 414/733, 736, 737, 738, 917; 901/12, 15, 40; 198/471.1, 750.12

(56) References Cited

U.S. PATENT DOCUMENTS

| | | | |
|---|---|---|---|
| 3,630,389 A | * 12/1971 | Schmidt et al. | ................ 414/4 |
| 3,902,606 A | * 9/1975 | Ronbeck | ..................... 414/733 |
| 4,585,389 A | * 4/1986 | Watanabe et al. | ...... 198/750.12 |
| 4,693,663 A | * 9/1987 | Brenholt et al. | ............. 414/735 |
| 4,784,562 A | * 11/1988 | Kishi et al. | ................. 414/917 |

* cited by examiner

Primary Examiner—Dean J. Kramer
Assistant Examiner—Michael Lowe
(74) Attorney, Agent, or Firm—Rosenberg, Klein & Lee (57) ABSTRACT

A plate member carrier is constructed to include a suction device adapted to suck and transfer the workpiece, a first four-bar linkage adapted to keep the suction device in horizontal, a second four-bar linkage adapted to prohibit the suction device from transverse displacement, and a cam adapted to control vertical movement of the suction device subject to a simple harmonic motion curve.

3 Claims, 9 Drawing Sheets

PLATE MEMBER CARRIER

BACKGROUND OF THE INVENTION

1. Field of the Invention

The present invention relates to a plate member carrier and, more particularly, to such a plate member carrier, which controls the lifting of the suction device by means of a simple harmonic motion.

2. Description of the Related Art

Figure 1:
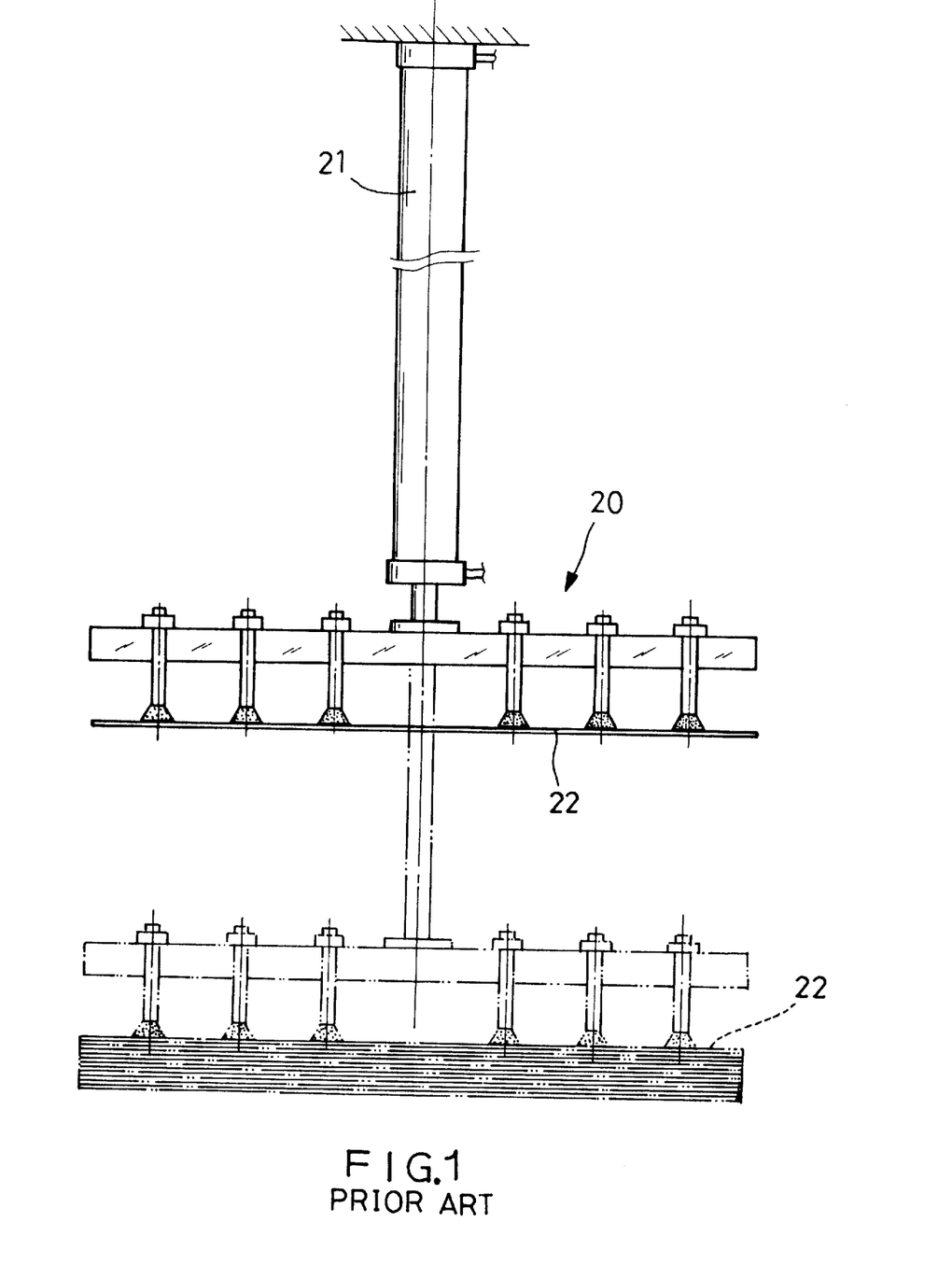
FIG. 1 is a schematic drawing showing an air cylinder type plate member carrier constructed according to the prior art.
Figure 2:
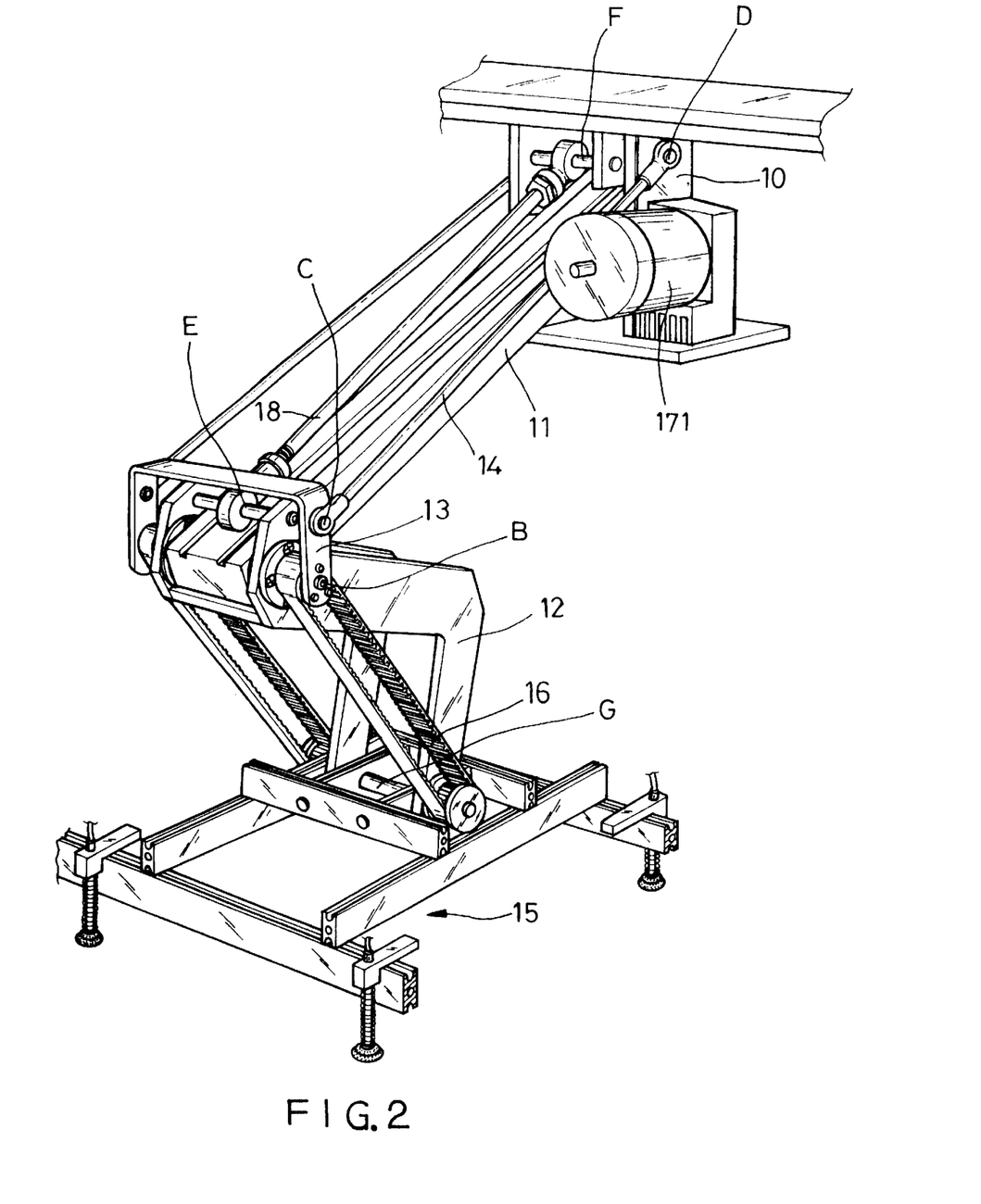
FIG. 2 is a perspective view of a plate member carrier according to the present invention.
Figure 3:
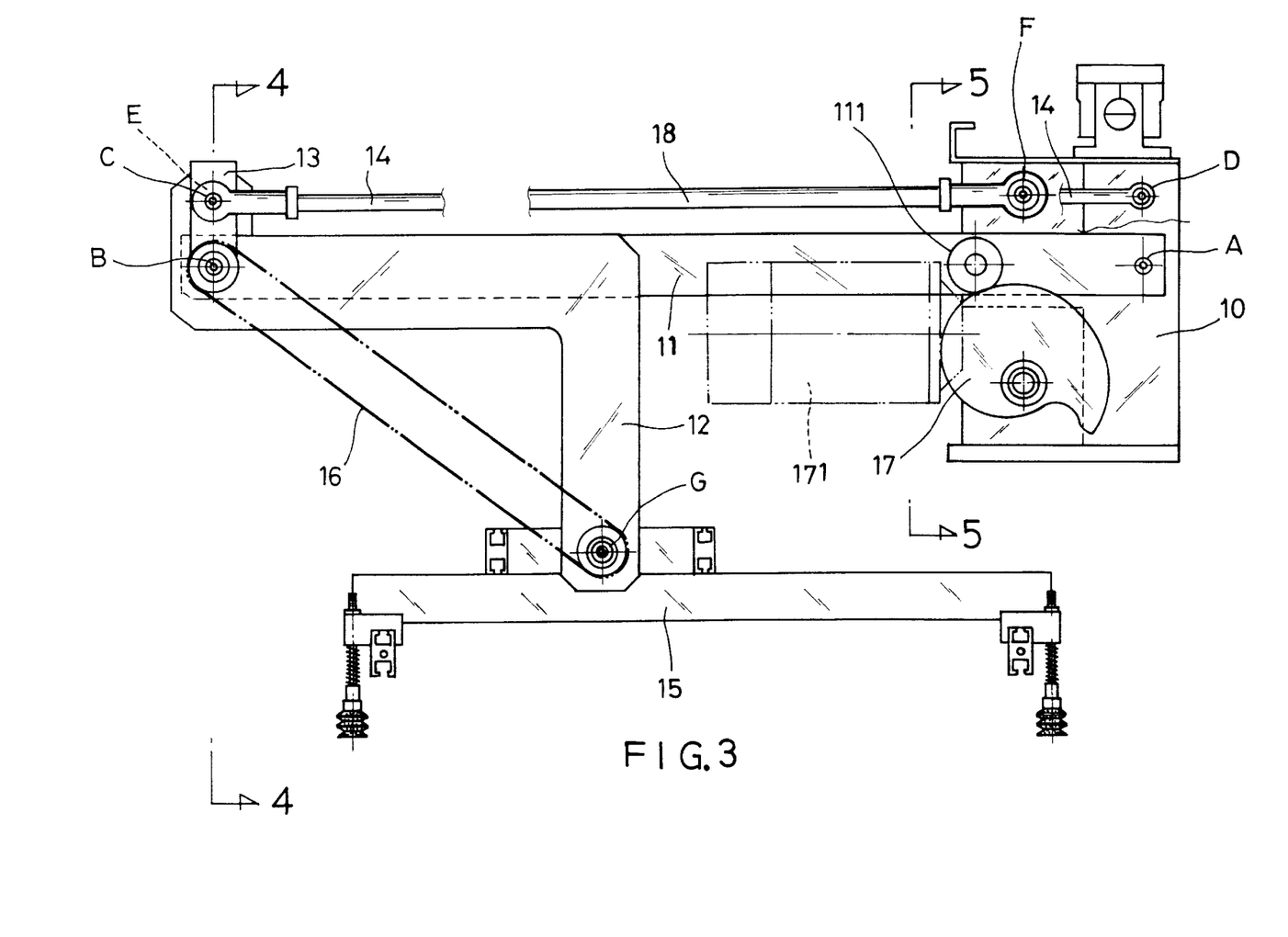
FIG. 3 is a front view of the plate member carrier according to the present invention.
Figure 4:
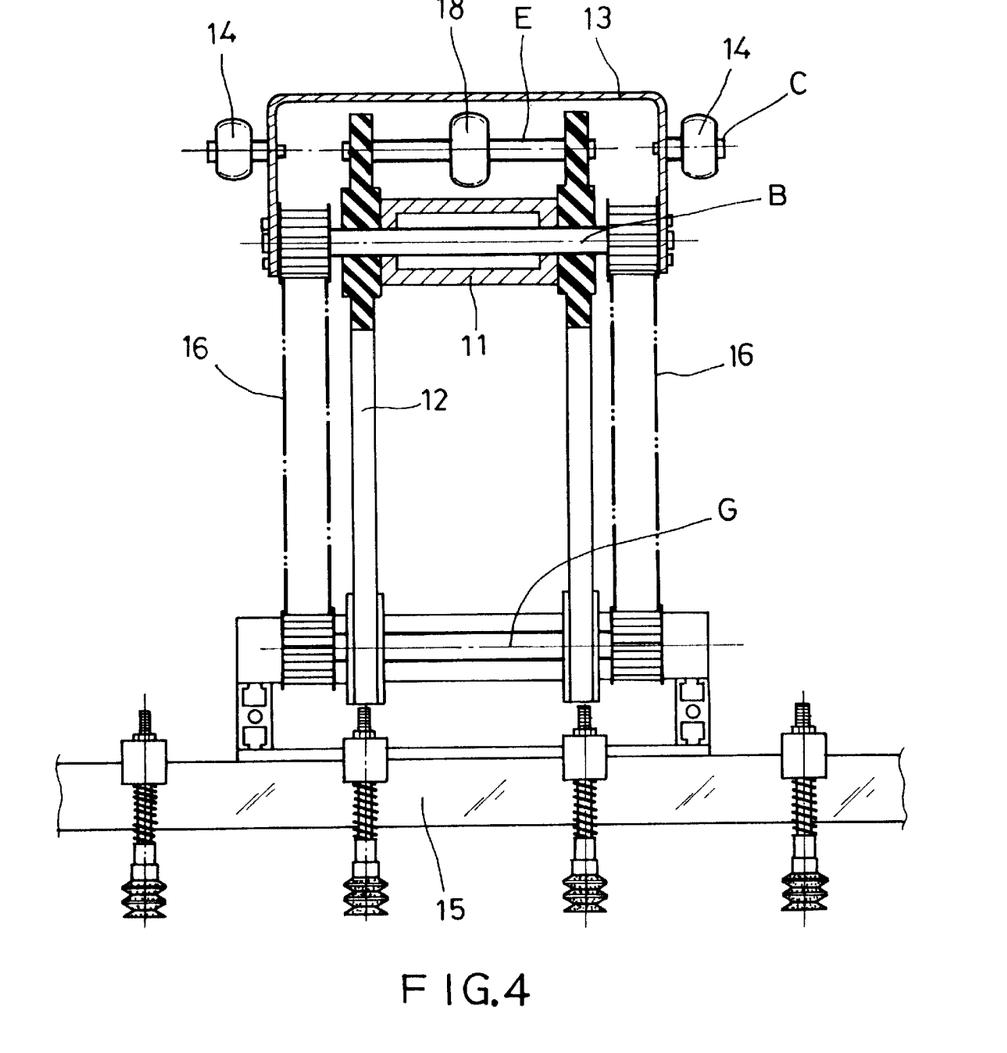
FIG. 4 is a sectional view taken along line 4—4 of FIG. 3.
Figure 5:
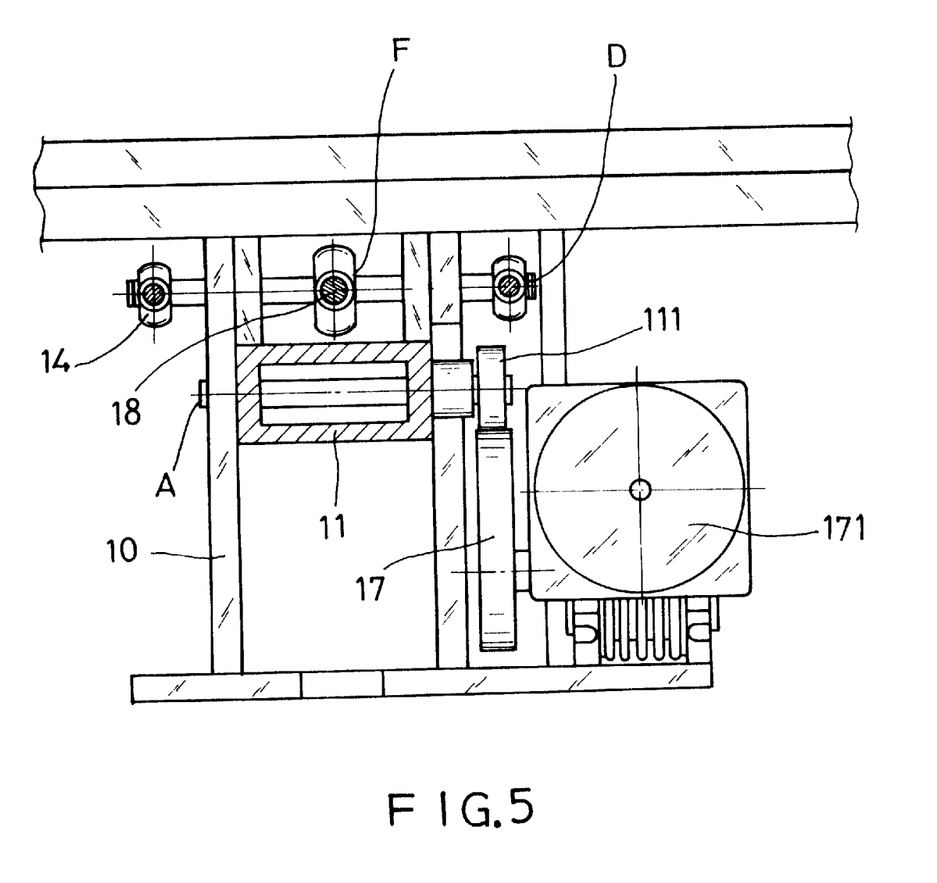
FIG. 5 is a sectional view taken along line 5—5 of FIG. 3.

FIG. 1 illustrates an air cylinder type plate member carrier constructed according to the prior art. This structure of air cylinder type plate member carrier comprises a suction device 20 adapted to suck and transfer the workpiece, and an air cylinder 21 adapted to move the suction device 20 vertically up and down. This structure of plate member carrier is still not satisfactory in function. At the initial or end stage of the action of the air cylinder 21, the suction device 20 and the machine base produce noises and vibrations, and the workpiece, for example, printed circuit board 22 tends to be forced out of the suction device 20, causing damage to the printed circuit board 22 or the machine base. Furthermore, the air cylinder 21 starts to wear quickly with use.

SUMMARY OF THE INVENTION

The present invention has been accomplished to provide a plate member carrier, which eliminates the aforesaid drawbacks. It is one object of the present invention to provide a plate member carrier, which moves the workpiece stably without vibration. It is another object of the present invention to provide a plate member carrier, which produces little noise during its operation. To achieve these and other objects of the present invention, the plate member carrier comprises a suction device adapted to suck and transfer the workpiece, a first four-bar linkage adapted to keep the suction device in horizontal, a second four-bar linkage adapted to prohibit the suction device from transverse displacement, and a cam adapted to control vertical movement of the suction device subject to a simple harmonic motion curve.

DETAILED DESCRIPTION OF THE PREFERRED EMBODIMENT

Figure 6:
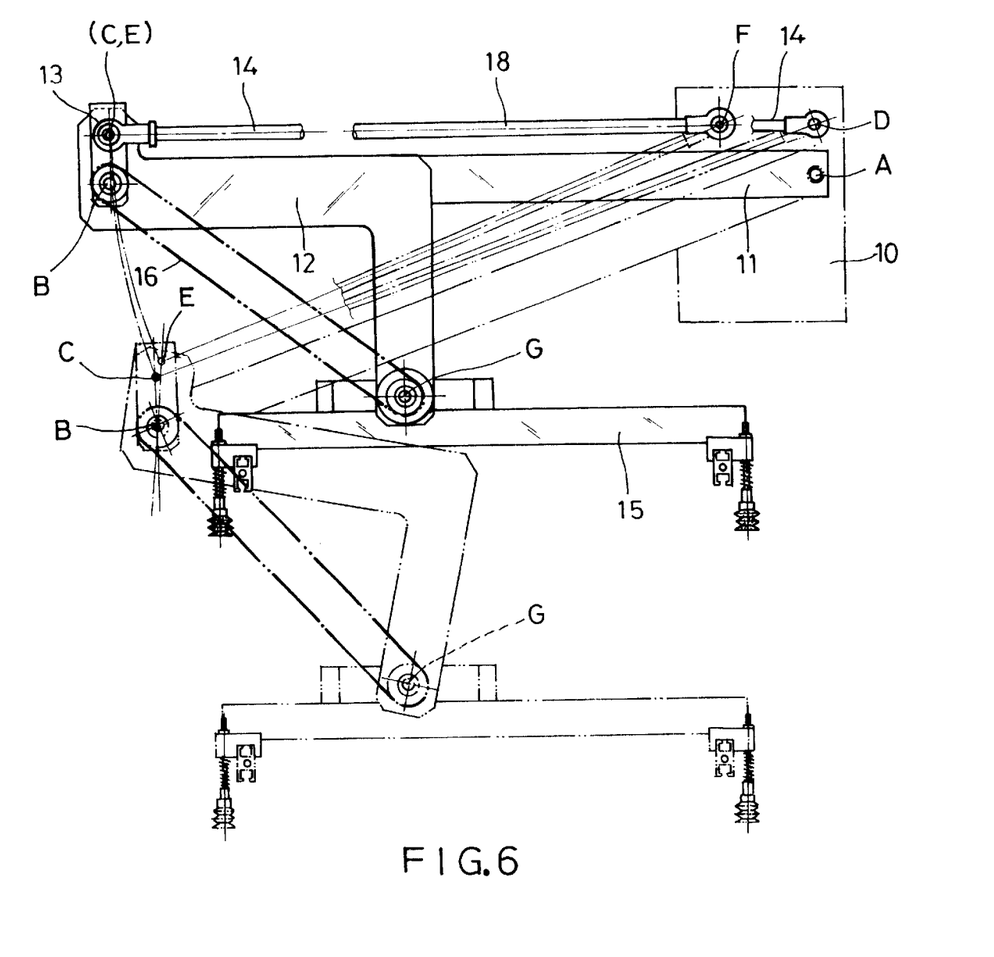
FIG. 6 is a schematic drawing showing the kinematic pair of the plate member carrier according to the present invention.

Referring to FIGS. from 2 through 5 and corresponding the FIGS. 2~5 to the kinematic pair of FIG. 6, a plate member carrier is shown comprising a bracket 10 fixedly mounted on a support frame, a suspension arm 11 pivoted with its front end to the bracket 10 at pivot point A, a crank 12 pivoted with its top end to the rear end of the suspension arm 11 at pivot point B, a substantially inverted U-shaped coupling rod 13 pivoted with its bottom side to pivot point B, a first link 14 having one end pivoted to the top side of the inverted U-shaped coupling rod 13 at pivot point C and the other end pivoted to a part of the bracket 10 at pivot point D, the first link 14 forming with the suspension arm 11 a part of a parallel-crank-four-bar linkage, a suction device 15 pivoted to the bottom side of the crank 12 at pivot point G, a transmission belt 16 coupled between the axle of the suction device 15 at pivot point G and the axle of the coupling rod 13 at pivot point B for enabling the axles to be rotated synchronously, a cam 17 designed subject to a simple harmonic motion curve and disposed in contact with a pulley 111 at one side of the suspension arm 11 for controlling the oscillation of the suspension arm 11, and a second link 18 having one end pivoted to the top side of the crank 12 at pivot point E and the other end pivoted to a part of the bracket 10 at pivot point F. Furthermore, a motor 171 is provided and controlled to rotate the cam 17 alternatively forwards and backwards.

Figure 7:
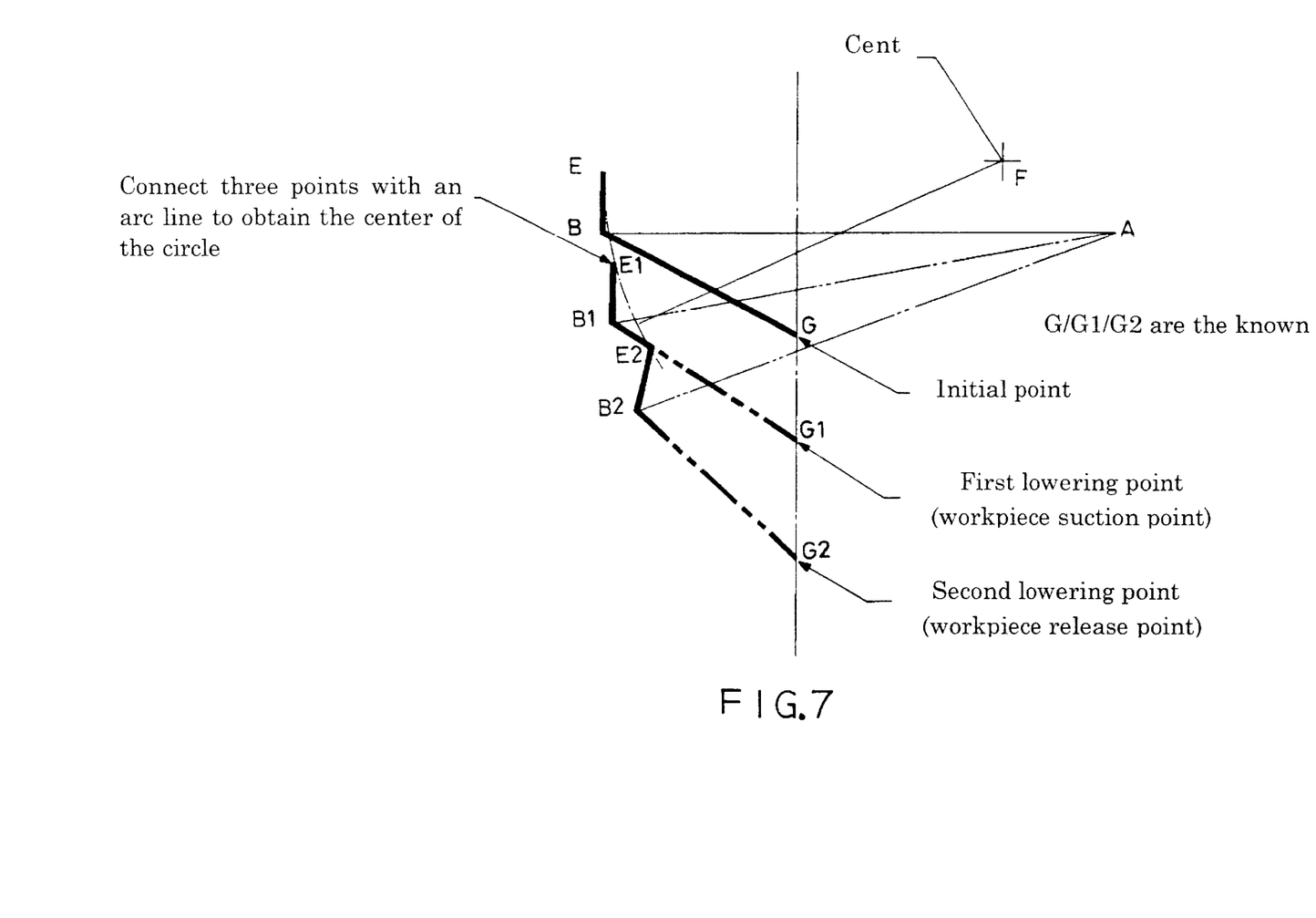
FIG. 7 is a schematic drawing explaining the design of the positioning of the second link according to the present invention.

Referring to FIG. 7, pivot point F of the second link 18 at the bracket 10 is determined by: setting at least three stop points of action (point G, point G1, and point G2) at the vertical line passing through the bottom end (pivot point G) of the crank 12, and then finding out the respective pivot points (B, B1, B2) of the crank 12 subject to the arc of oscillation of the suspension arm 11, and than connecting the top ends (E, E1, E2) of the crank 12 at the respective three different positions with an arc line, and then marking out the center of the arc line, i.e., the pivot point F of the second link 18 at the bracket 10. Based on this design, the assigned stop points of action of the bottom end (point G) of the crank 12 (points G, G1, G2 are assigned to be the initial point, workpiece suction point, and workpiece release point respectively) are located on the same vertical line, therefore the suction device 15 is free from the affect of the transverse displacement of the bottom end of the crank 12 during action of the crank 12.

Figure 8:
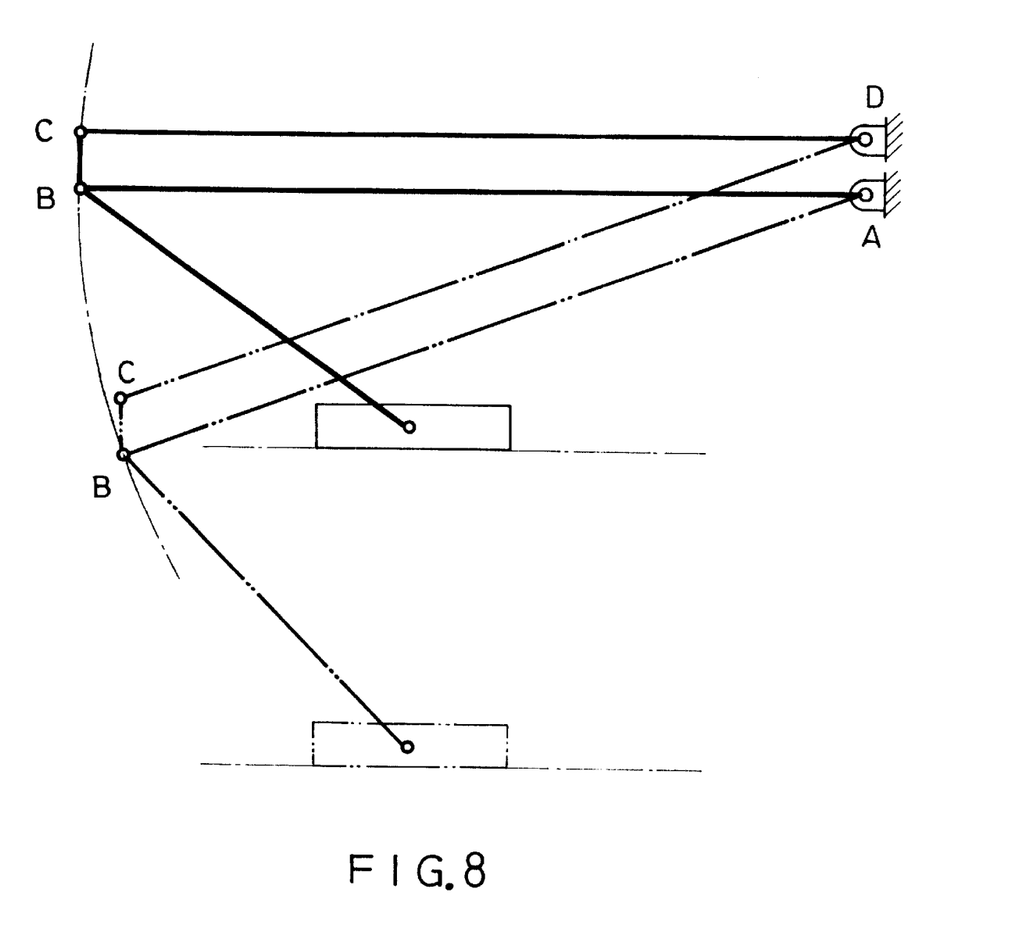
FIG. 8 is a schematic drawing showing the motion of the parallel crank four-bar linkage of the plate member carrier according to the present invention.
Figure 9:
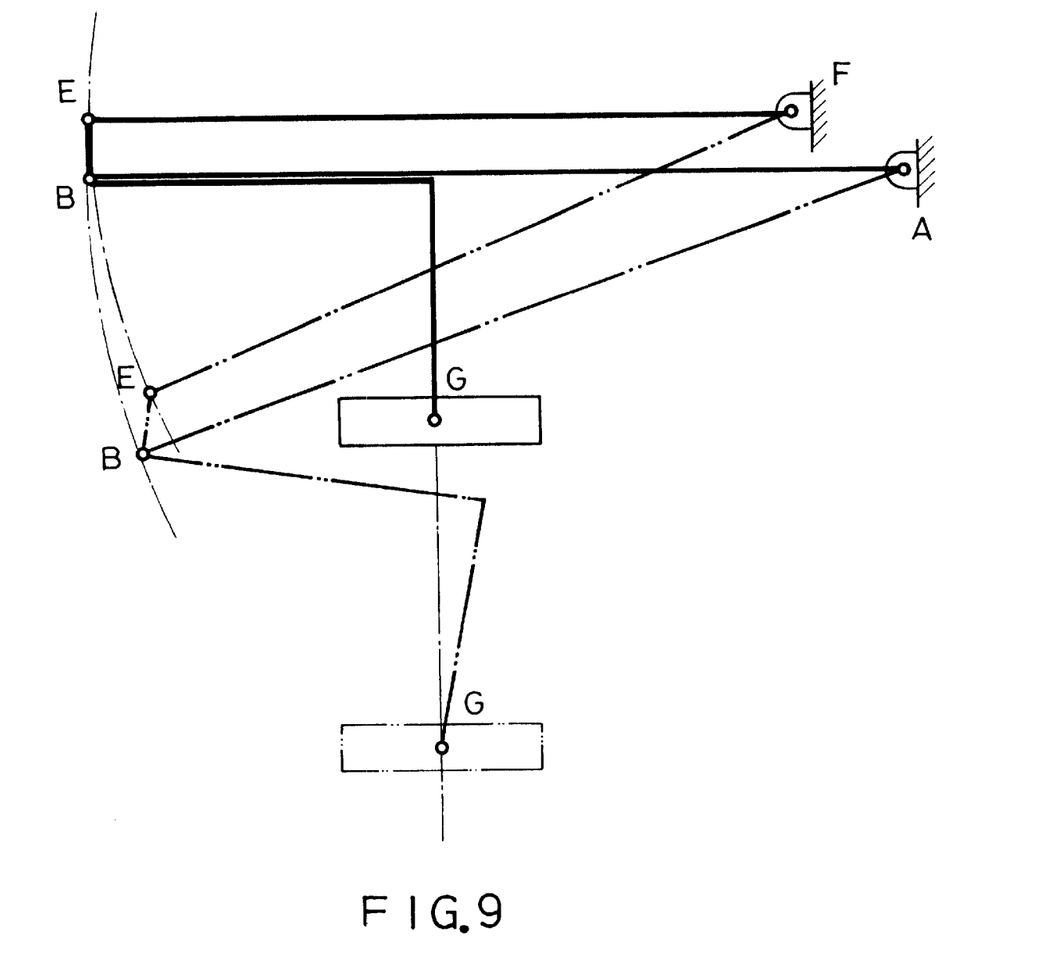
FIG. 9 is a schematic drawing showing the motion of the second four-bar linkage of the plate member carrier according to the present invention.

The bracket 10, the suspension arm 11, the coupling rod 13 and the first link 14 form a parallel crank four-bar linkage (see FIG. 8). During oscillation of the suspension arm 11, the transmission belt 16 is driven to move the suction device 15, keeping the suction device 15 in horizontal. The bracket 10, the suspension arm 11, the crank 12 and the second link 18 form a four-bar linkage (see FIG. 9). As described above, the bottom end of the crank 12 (the mounting point of the suction device 15) does not displace transversely at a particular stop point of action.

As indicated above, the plate member carrier uses a first four-bar linkage to keep the suction device 15 in horizontal, a second four-bar linkage to prohibit the suction device 15 from transverse displacement, and a cam 17 to control vertical movement of the suction device subject to a simple harmonic motion curve.

A prototype of plate member carrier has been constructed with the features of the annexed drawings of FIGS. 2~9. The plate member carrier functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A plate member carrier comprising:

a bracket fixedly mounted on a support frame;

a suspension arm, said suspension arm having a front end pivoted to said bracket and a rear end;

a crank, said crank having a top end pivoted to the rear end of said suspension arm and a bottom end;

a inverted U-shaped coupling rod, said inverted U-shaped coupling rod having a bottom side mounted with an axle pivoted to the top end of said crank and the rear end of said suspension arm and a top side;

a first link forming with said suspension arm a part of a parallel-crank-four-bar linkage, said first link having a first end pivoted to the top of side of said inverted U-shaped coupling rod and a second end pivoted to a part of said bracket;

a suction device, said suction device having an axle pivoted to the bottom end of said crank;

transmission belt means coupled between the axle of said suction device and the axle of said inverted U-shaped coupling rod for enabling the axles to be rotated synchronously;

a cam disposed in contact with a pulley at one side of said suspension arm for controlling oscillation of said suspension arm along a simple harmonic motion curve; and a second link, said second link having a first end pivoted to the top end of said crank and a second end pivoted to a part of said bracket.

2. The plate member carrier as claimed in claim 1, wherein the pivot point of said second link at said bracket is determined by: setting three stop points of action at the vertical line passing through the bottom end of said crank, and then finding out the respective pivot points of said crank subject to the arc of oscillation of said suspension arm, and then connecting the top ends of said crank at the respective three different positions with an arc line, and then marking out the center of said arc line as the pivot point of said second link at said bracket.

3. The plate member carrier as claimed in claim 1, further comprising a motor controlled to rotate said cam alternatively forwards and backwards.

* * * * *